United States Patent [19]

Bogel

[11] 4,065,669
[45] Dec. 27, 1977

[54] SOLID-STATE LIMIT SWITCH UTILIZING INFRARED LINK

[75] Inventor: George F. Bogel, Pittsburgh, Pa.

[73] Assignee: Westinghouse Electric Corporation, Pittsburgh, Pa.

[21] Appl. No.: 664,115

[22] Filed: Mar. 5, 1976

Related U.S. Application Data

[63] Continuation of Ser. No. 464,731, April 26, 1974, abandoned.

[51] Int. Cl.² ............................................. G01D 5/34
[52] U.S. Cl. ................................ 250/229; 250/214 R; 307/311
[58] Field of Search ................. 307/311; 250/338, 229, 250/205, 231 SE, 214 R; 317/124–130

[56] References Cited

U.S. PATENT DOCUMENTS

| 3,495,777 | 2/1970 | Evalds et al. | 317/124 |
| 3,631,250 | 12/1971 | Van Buskirk | 250/205 |
| 3,721,123 | 3/1973 | Heim | 250/231 SE |
| 3,783,274 | 1/1974 | Towne et al. | 250/229 |

*Primary Examiner*—David C. Nelms
*Attorney, Agent, or Firm*—M. J. Moran

[57] ABSTRACT

A limit switch utilizing static components and an infrared light emitting diode in conjunction with a photosensitive transistor. A mechanical shutter is provided for insertion between the diode and transistor to interrupt the infrared link therebetween, this will occur when a predetermined limit is reached by an object which is controlled by the limit switch. The limit switch is of the two terminal type, that is it requires no separate source of power for operation than the power in the line being controlled by the switch. It is adapted for high temperature operation.

5 Claims, 11 Drawing Figures

SOLID-STATE LIMIT SWITCH UTILIZING INFRARED LINK

This is a continuation of application Ser. No. 464,731 filed Apr. 26, 1974, now abandoned.

BACKGROUND OF THE INVENTION

Subject matter of this invention relates generally to limit switches and in particular to solid-state, two terminal switches utilizing infrared links.

U.S. Pat. No. 3,693,060 to Joyce issued Sept. 19, 1972 is drawn to a solid-state relay utilizing a light emitting diode to transmit visual spectrum optical energy steadily to a photosensitive solid-state element. The Joyce Patent utilizes two separate sources of power for the light emitting diode and the load. In addition, in the Joyce Patent the power supplied to the light emitting diode is not affected by the conductivity of a silicon controlled rectifier which is controllable by the light emitting diode.

U.S. Pat. No. 3,676,685 to Myer issued July 11, 1972, is drawn to a light responsive switching circuit capable of use in relatively high powered applications. The Myer Patent teaches a modularized light-responsive switching circuit capable of use in relatively high power applications. The circuit includes a Triac connected as a switching element in series with a power source and a load. The gate electrode of the Triac is connected to a light-responsive gating circuit including a capacitor and at least one light-responsive resistor switchable between two resistance levels. The capacitor is charged when the light-responsive resistor assumes one resistance level and is discharged into the gate of the Triac when the light-dependent resistor assumes the other resistance level. The components of the switching circuit are encapsulated in a cylindrical module having a screen therein, through which the active surface of the light-responsive resistor can receive light, and having a pair of terminals to connect the module directly into a power circuit.

U.S. Pat. No. 3,421,005 issued to Baker on Jan. 7, 1969, teaches an ambient light controlled solid-state relay which like the Myer Patent teaches an element in a circuit which is responsive to ambient light conditions.

U.S. Pat. No. 3,418,480 to Miller issued Dec. 24, 1968, is directed to a lighting control employing photocells and gas diodes to operate semiconductor switches. The Miller Patent is directed to a light emitting diode which is a neon bulb and a light responsive device which is a photoresistor that controls a semiconductor controlled recitifer.

All of the previous described patents teach light emitting and/or light sensitive devices used alone or in conjunction to control electrical circuitry. In the prior art electrical limit switches are taught which utilize mechanical devices in some cases and electrical devices in other cases to sense when the limits of travel or movement of a workpiece or other similar apparatus has been reached to thereby produce a force or occurrence which will cause the workpiece or similar apparatus to either stop or change direction. It is known in the prior art to provide high reliability limit switches of the type previously described by sealing them in special containers which may be oil tight or fluid tight so that limit switches may be used in environments which are exposed to oil or other substances which might foul the limit switch and cause it to foil. It would be advantageous if a limit switch were available which was highly reliable in environments of high temperature and in environments where substances such as oil may be present. Regardless of how tightly a mechanical apparatus is sealed it is possible for oil and other products to leak into the mechanism to foul it. In addition where light transmitting links are utilized in switching circuitry, the use of a relatively opaque oil base material near that circuitry may interrupt the visible light link. It would therefore also be advantageous if a highly reliable limit switch were available which is of the solid-state or static variety, which employs a means for causing a limiting function to occur which means is not adversely effected by the presence of oil nor adversely effected by the presence of heat. It would also be advantageous if this solid-state limit switch was of a two terminal variety or said in another way was adapted to be self-powered by the power in the load to be protected or switched as the case may be.

SUMMARY OF THE INVENTION

In accordance with the invention a solid-state or static limit switch is provided which utilizes electrical circuitry having an infrared or non-visible light link therein for causing the proper limitation to occur. In the preferred embodiment of the invention a mechanical shutter which is driven by a suitable mechanical means is adapted to interrupt an infrared link between an infrared light emitting photodiode and an infrared sensitive phototransistor thus causing a gated device to change state to thereby close a switch which then energizes a means which is suitable for controlling the movement of a device to be limited in movement. In accordance with the invention the static or solid-state circuitry is of the two terminal variety.

BRIEF DESCRIPTION OF THE DRAWINGS

For a better understanding of the invention reference may be had to the preferred embodiments exemplary of the invention shown in the accompanying drawings in which.

DESCRIPTION OF THE PREFERRED EMBODIMENTS

Figure 1:
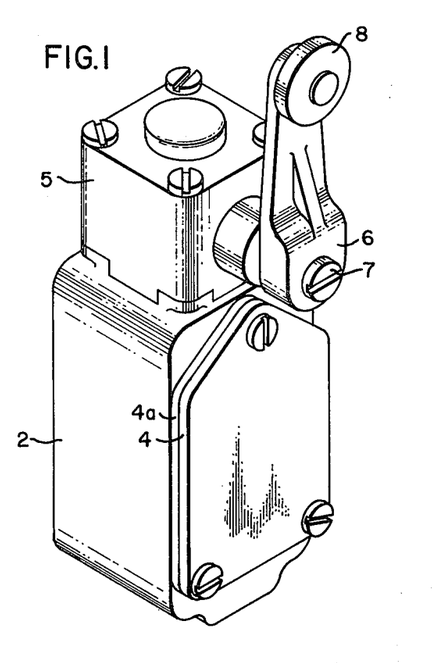
FIG. 1 shows the outside casing and apparatus of one embodiment of a solid-state limit switch.

Referring now to the drawings and FIG. 1 in particular, a solid-state limit switch is shown having an outer protective casing 2. There is a suitable opening in the outer protective casing 2 through which components may be placed inside of the outer protective casing 2 and sealed or closed therein by way of a front panel generally designated 4, having a gasket 4a which provides a relatively oil tight seal between the outer surface of the casing 2 and the material or apparatus on the inside of the casing 2. There is also provided a mechanical arm 6 which is rigidly attached to a shaft 7 which pivots when the arm 6 is moved as may be the case when a load or workpiece or similar mechanical means makes contact with the wheel 8 shown at the upper end of the arm 6. The shaft 7 feeds into a module 5 which is disposed on one surface of the casing 2 and which is also oil tight. By causing the mechanical lever 6 to rotate clockwise or counterclockwise a suitable means inside the outer protective casing 2 is actuated to cause a limit switch operation cycle to take place. It is to be understood with regard to the embodiment shown in FIG. 1 that other means may be provided for initiating the operation of a limit switch cycle. As an example, the shaft 7 and arm 6 may be replaced by a similar device which moves inwardly and outwardly in the presence of a workpiece and the device may be in the orientation shown in FIG. 1 or may be disposed on top of the module 5. None of the above-mentioned means is limiting in nature.

Figure 2:
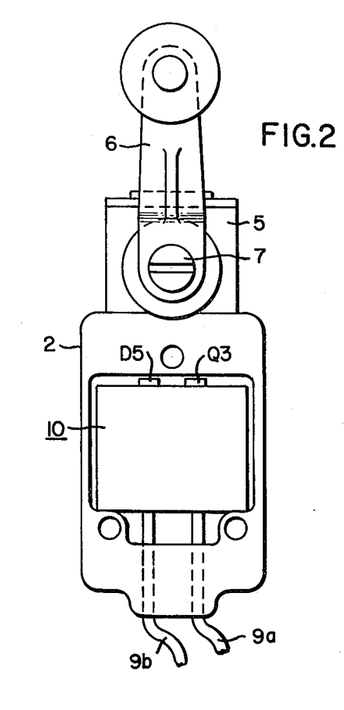
FIG. 2 shows a view of the limit switch of FIG. 1 with the cover removed to show internal elements of the limit switch.

Referring now to FIG. 2, a view of the switch apparatus of FIG. 1 is shown in which the front plate 4 has been removed. Module 5 is shown disposed adjacent to the outer casing 2 and the shaft 7 is shown protruding without its arm 6. There are shutter means adjacent to the shaft 7 designated Sh for movement as the shaft 7 is actuated as described previously. Also shown is a module 10 which is a solid-state electronic limit switch member, there is shown on one portion of the limit switch member 10 a device generally designated D5 which may be an infrared light emitting diode and a complementary device Q3 which may be an infrared light sensitive transistor. Shown extending from the bottom of the outer casing 2 are pigtail leads or electrically conductive wires 9a and 9b.

Figure 3:
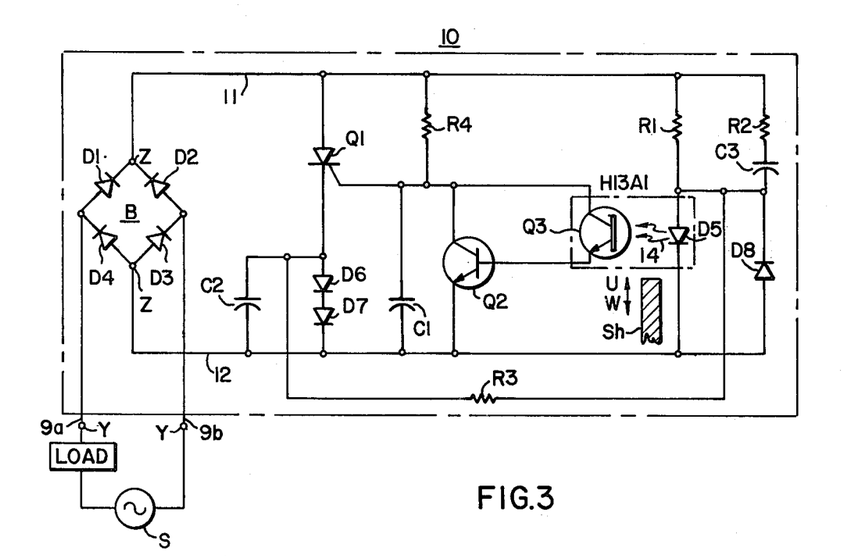
FIG. 3 shows a schematic diagram of a portion of the limit switch such as shown in FIGS. 1 and 2.

Referring now to FIG. 3, electronic circuitry which may be disposed within the module 10 is shown. There is also a LOAD which may be connected in circuit relationship to lines 9a and 9b at one of the terminals Y—Y, which are the input terminals of a full-wave rectifier bridge B. Connected to the other of the terminals Y—Y may be a source S of AC or other alternating current power. It is to be understood that the LOAD and source S do not comprise part of the invention per se and their interconnection whether in series, parallel or any other circuit relationship is not limiting in any way. The previously described diode bridge B comprises four diodes D1, D2, D3 and D4. The output terminals of bridge B are designated Z—Z. The lower line Z is connected to a system common terminal 12 and the upper line Z is connected to a system signal line 11. Connected to line 11 is the anode of a silicon controlled rectifier or similar gated control means Q1. The cathode of the control means Q1 is connected to the anode of a diode D6 the cathode of which is connected to the anode of another diode D7. The cathode of the last mentioned diode D7 is connected to the previously described system common line 12. Connected in parallel circuit relationship across the series combination of the diodes D6 and D7 is a capacitive element C2. The gate of the previously described gated control means or element Q1 is connected to one side of a capacitive element C1 the other side of which is connected to the system common line 12. Connected in parallel circuit relationship with the last mentioned capacitive element C1 is a transistor or similar controlled valve generally designated Q2. In this embodiment of the invention the valve Q2 comprises an NPN transistor, the collector of which is connected to one side of the capacitive element C1 at the gate of the controlled element Q1 and the emitter of which is connected to the other side of the capacitive elements C1 at the common line 12. In this embodiment of the invention there is a photosensitive transistor Q3 connected in Darlington-Pair relationship with the last mentioned transistor or valve Q2. The photosensitive transistor or gated device Q3 comprises a collector connected to the collector of the last mentioned transistor Q2 and an emitter connected to the base of the last mentioned transistor Q2 so that the transistor Q2 and the transistor Q3 form the aforementioned Darlington-Pair configuration. Connected to the gate of the previously described controlled element Q1 is one side of a resistive element R4 the other side of which is connected to the line 11. Also connected to line 11 is another resistive element R1 the other side of which is connected to one side of an infrared light emitting diode D5, at the anode thereof. The cathode of diode D5 is connected to line 12. There is a resistive element R2 connected at one end to the line 11 and the other end to one side of a capacitive element C3. The other side of the capacitive element C3 is connected concurrently to the cathode of a diode D8, one side of a resistive means or resistive element R3, and the anode of the previously described diode D5. The other side of the resistive element R3 is connected to the anode of the previously mentioned diode D6. As was mentioned previously both the diode D5 and the transistor Q3 are shown disposed outside of the module 10. There is also shown a shutter element generally designated Sh which is opaque to infrared light and which is shown in this embodiment of the invention disposed to move physically to a point between the previously described diode D5 and transistor Q3 to interrupt the infrared light or link 14. The movement of the shutter element in a direction U or a direction W will cause the switching module 10 to react to cause the LOAD and source S to be connected or disconnected as the case may be at the terminals Y—Y.

OPERATION OF THE CIRCUITRY OF MODULE 10

For convenience the electrical operation of the circuitry of module 10 has been broken down into four stages:

The first stage occurs when the switch of the circuitry of module 10 is in the off state, which is the noninfrared light blocking state, which corresponds to the opaque shutter Sh being in a withdrawn state from a point between transistor Q3 and the light emitting diode D5, which represents the condition when little current is flowing in the LOAD.

Stage two is the off-to-on transient as the shutter S*h* is being inserted or move to a point between the diode D5 and the transistor Q3.

Stage three is the switch on state, which is the light blocking state when the shutter has been completely inserted to the point between the diode D3 and the photosensitive element Q3, which state represents large current flowing in the LOAD.

Stage four is the on-to-off transient as the shutter S*h* is being withdrawn from the point between diode D5 and the transistor Q3. It is to be understood that the four stage concept is illustrative and not limiting.

Figures 4, 4A:
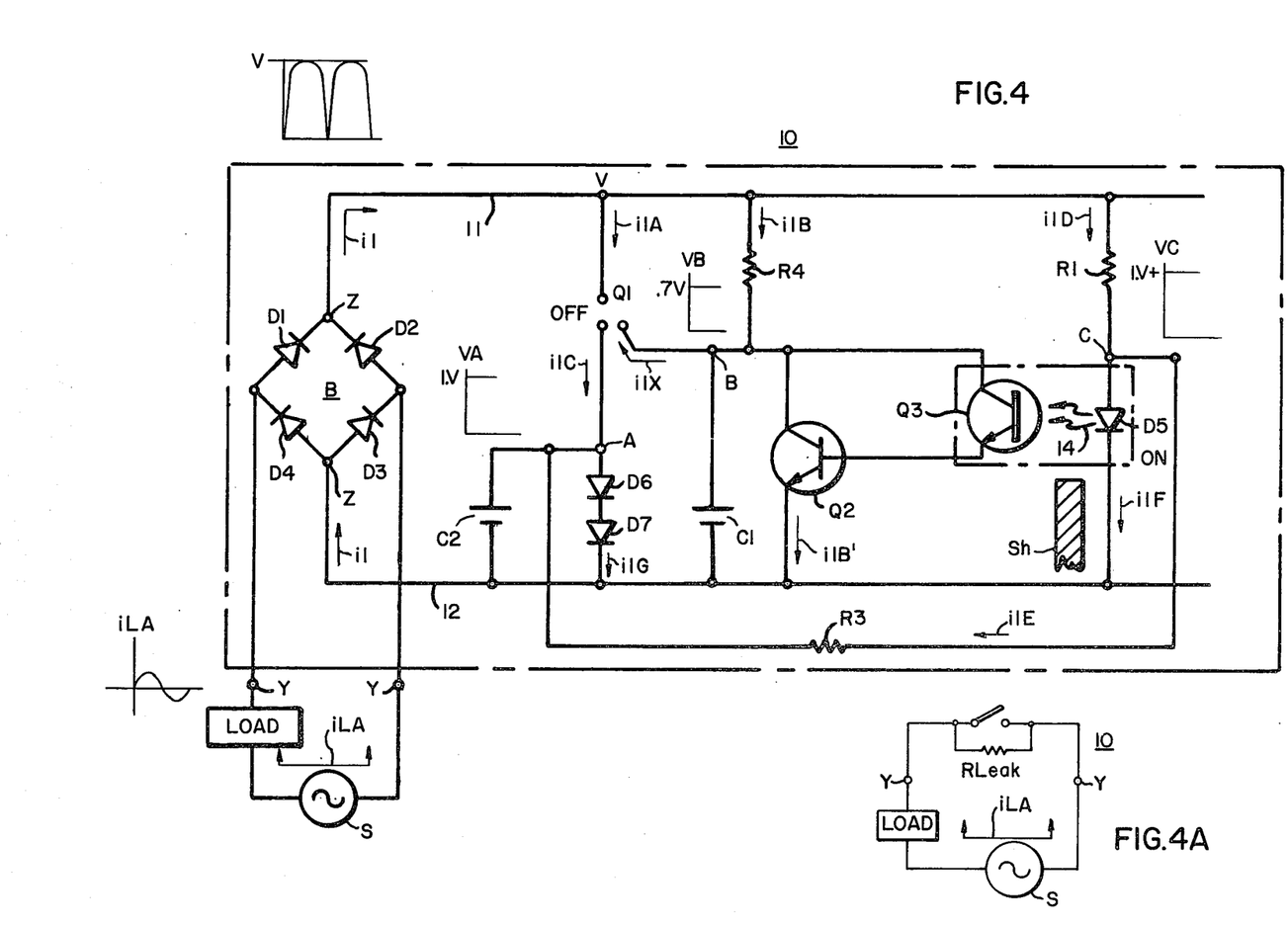
FIG. 4 shows a circuit diagram of the limit switch shown in FIG. 3 when the switch is on or in a light blocking state, where current is flowing in the load controlled by the switch.
FIG. 4A shows a simplified circuit diagram of the circuit of FIG. 4.

Referring now to FIG. 4 the circuitry of FIG. 3 is shown in the switch off state which is otherwise known as the non-infrared light blocking state or the state in which there is little current flowing in the LOAD. The current flowing in the LOAD, which is of a very low magnitude, is generally designated $i$LA. This current flows into line 11 as current $i$1, it returns to the source S by way of line 12 at which line it is also designated at $i$1. Since the shutter S*h* is in a position of not interfering with the infrared light link 14 between the diode D5 and the photosensitive transistor Q3, the silicon controlled rectifier Q1 is in a non-conducting or off state. Consequently, current $i$1A is negligible. Current $i$1B which flows through resistive element R4 is conducted by way of the Darlington-Pair combination Q2–Q3 which is in the on or saturated state, to the return line 12, consequently, gate current $i$1X for the silicon controlled rectifier Q1 is low as is expected when the silicon second controlled rectifier Q1 is in the off or non-conducting state. The capacitive element C1 is made to appear as a voltage source of approximately 0.7 volts, said in another way the capacitive element C1 working in conjunction with the generally saturated collector-to-emitter circuit of the transistor element Q2 maintains the junction point B at approximately 0.7 volts. Capacitive element C2 cooperates with diodes D6 and D7 to maintain the junction point A at a voltage of approximately 1.0 volt. Since the voltage at the cathode of the silicon controlled rectifier Q1 is higher than the voltage at the gate thereof, and since the gate current $i$1X is low, the silicon controlled rectifier Q1 will be maintained in an off or non-conducting state. Current $i$1C which flows between the cathode of the silicon controlled rectifier Q1 and the junction point A is different from current $i$1A by the gate leakage current $i$1X. Current $i$1G which flows through the two previously described D6 and D7 is different from current $i$1C by the current $i$1E which flows in resistive element R3. Current $i$1E is derived from current $i$1D which flows through the resistive element R1 into junction point C. Junction point C is maintained at slightly larger than 1.0 volt positive. Diode D5 has flowing therethrough a current $i$1F which is also derived from current $i$1D and which is sufficient to maintain the diode D5 in the on or saturated state. Such being the case the magnitude of infrared light 14 which links diode D5 and phototransistor Q3 is relatively large. Consequently, because of the Darlington-Pair configuration of the transistors Q2 and Q3, most of the current $i$1B flows in the emitter circuit of the transistor Q2 where it is designated as $i$1B′. This has the effect of sinking current away from the gate of the silicon controlled rectifier Q1. Under most conditions the impedances of the circuits in which currents $i$1B and $i$1D flow are high. Since the silicon controlled rectifier Q1 is off the current $i$1A is low. Consequently, the impedance between the points Z—Z of the bridge B is large and thus very little current (leakage current) $i$LA flows through the LOAD. This corresponds to the switch or switch module 10 being opened.

Referring now to FIG. 4A a simplified schematic diagram of the circuit shown in FIG. 4 is depicted. In this case it will be noted that the current $i$LA cannot flow through the opened switch 10 but must flow through the high leakage resistance Rleak.

Figures 5, 5A:
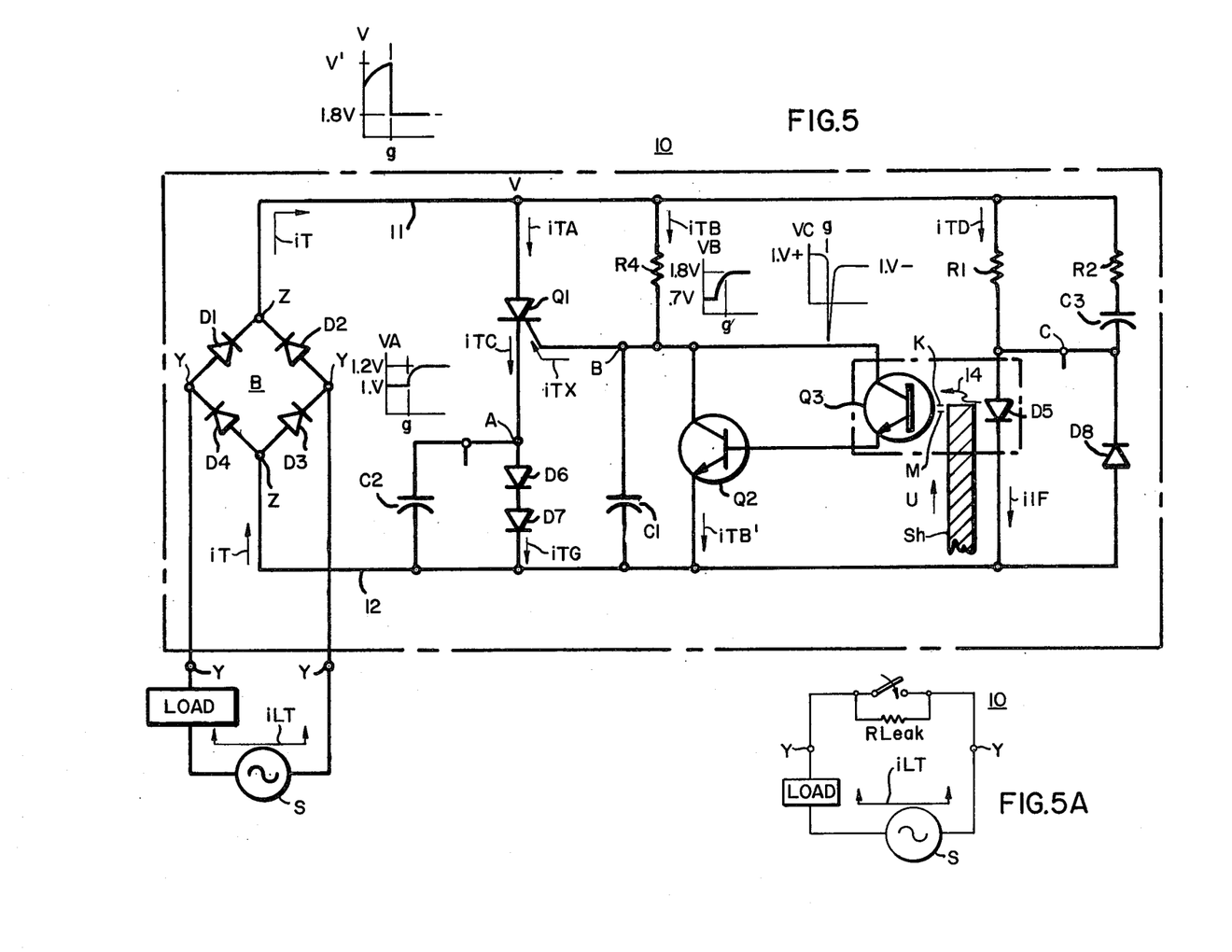
FIG. 5 shows the circuit of FIG. 3 during the transient condition from the switch on to the switch off stage.
FIG. 5A shows a simplified circuit diagram of the circuit of FIG. 5.

Referring now to FIG. 5 the circuit of FIG. 3 is once again depicted, but this time in a transient state between the previously described off condition of FIG. 4 and an on condition which will be described later herein with respect to FIG. 6. The current flowing through the LOAD is generally designated as $i$LT. This current is further designated $i$T as it flows in lines 11 and 12. The transient state of FIG. 5 is initiated by moving the shutter S*h* in a direction U to intercept or block a portion of the infrared light 14 emanating from diode D5. This causes less light to impinge upon the phototransistor Q3 thus tending to take the Darlington-Pair Q2-Q3 out of saturation into the linear region of operation. Said in another way this means that the Darlington-Pair configuration of transistors Q2 and Q3 begins to act as an amplifier such that current $i$TB′ which flows in the collector-to-emitter circuit of transistor Q2 is somehow related to the amount of infrared light 14 which impinges upon the phototransistor Q3. Since the Darlington-Pair Q2-Q3 is not saturated, current $i$TB′ is less than current $i$TB which is flowing in resistor R4. Consequently, more current $i$TX is available for the gate of the silicon controlled rectifier Q1. The capacitive element C1 cooperates with the collector-to-emitter circuit of transistor Q2 to allow the voltage at the junction point B to move upwardly from the 0.7 volt level associated with FIG. 4. The voltage at point B eventually reaches a value, at time *g*, where the voltage at point B is sufficiently larger than the relatively fixed voltage at the point A to forward bias or turn on the silicon controlled rectifier or similar gated control means Q1. Likewise there is now sufficient current $i$TX available for completing the gating action of the silicon controlled rectifier Q1. The silicon controlled rectifier Q1 becomes quickly saturated or turned on once the time *g* is reached, this causes current $i$TA to increase to a relatively high level through the silicon controlled rectifier Q1 and the diodes D6 and D6. The current $i$TC which flows between the cathode of the silicon controlled rectifier Q1 and junction point A is comprised of the currents $i$TA and $i$TX. The current $i$TG which heavily saturates the diodes D6 and D7, thus raising the voltage at point A to approximately 1.2 volts in this embodient of the invention, is substantially the same as current $i$TC because the exchange of current between point A and point C through resistive element R3 is insignificant relative to other associated currents during this transient period. Since silicon controlled rectifier Q1 is turned on relatively rapidly, the voltage difference between lines 11 and 12 rapidly deteriorates or drops from some value V′ to approximately 1.8 volts which is the total series saturation voltage value of the two diodes D6 and D7 and the anode-to-cathode path of the silicon controlled rectifier Q1. The negative voltage spike which would normally be impressed across the diode D5 tending to reverse bias it is reflected through the capacitive element C3 to junction point C. This causes the diode D8 to be forward biased so that current is drawn from line 12 through diode D8 to charge the capacitive element C3 through the resistor or resistive means R2 this preventing damage to the diode D5. The later voltage recovers relatively rapidly from its negative peak to approximately 1 volt (minus) at point C. Concurrently, current iTD drops rapidly because of the relative short circuit that is provided by the now conducting silicon controlled rectifier Q1. Said in another way silicon controlled rectifier Q1 in the conducting state acts as a sink for current which would otherwise be available in greater quantity to energize the diode D5. This rapid combination of events which includes the rapid reverse biasing of diode D5 and the rapid reduction of current iTD for diode D5 causes the infrared light emitting diode D5 to quickly reduce the amount of infrared radiation 14 available for energizing the photosensitive transistor Q3 even though the shutter Sh has not been moved in direction U appreciably. Of course, if the phototransistor Q3 is rapidly deenergized as is the case according to the previous condition the current iTB' becomes correspondingly smaller and the current iTX becomes correspondingly larger within limits so that the Darlington-Pair configuration Q2-Q3 rapidly moves towards the off or nonconducting state while the silicon controlled rectifier Q1 moves rapidly towards the on or conducting state. Consequently, it can be seen that the net effect of moving the shutter Sh in a direction U so as to interrupt a given amount of infrared radiation 14 is to cause the switch B to close with a snap action or latch closed because of the interaction of the electronic components of the circuitry of FIG. 5.

Referring now to FIG. 5A a simplified schematic diagram of the circuit of FIG. 5 is shown in which the switch 10 is shown being moved towards the closed state. At this time it may be said that the electrical current iLT is in a transient state.

Figures 6, 6A:
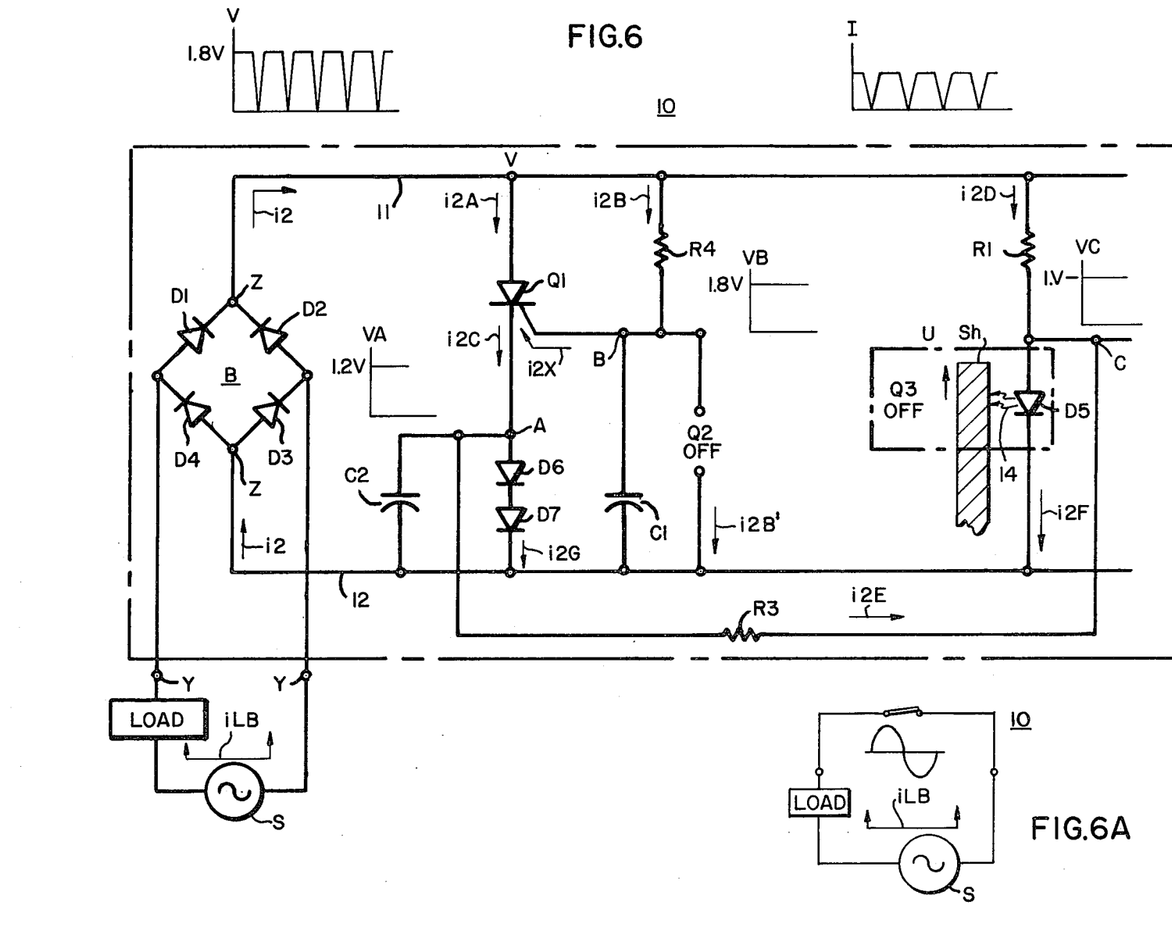
FIG. 6 shows the circuit of FIG. 3 in the off or non-light blocking stage where little current is flowing in the load controlled by the switch.
FIG. 6A shows a simplified schematic circuit diagram of the circuit of FIG. 6.

Referring now to FIG. 6 the circuit diagram of FIG. 3 is shown in the switch-on or infrared blocking state otherwise known as the state in which appreciable current is flowing in the LOAD. In this state significant LOAD current iLB flows in the LOAD and into and out of the bridge terminals Z—Z where it is described as current i2. The voltage drop between the lines 11 and 12 is approximately 1.8 volts which is the forward voltage drop across the two diodes D6 and D7 and the silicon controlled rectifier Q3 in a heavily conducting state. It will be noted that the wave shape V shows occasional negative spikes which correspond to the forward rectified LOAD current iLB going to zero during each half cycle. In such a case it is desirous to maintain the diode D5 in a low conducting state. That is to say it is desirous to keep the diode D5 conducting some minimal amount of current i2F. This current is supplied from the capacitive element C2 which appears in this case as if it were a battery. Consequently, when current i2C, which normally supplies the light emitting diode D5 with current i2E, drops to zero each half cycle the charged capacitor C2 supplies the current i2E through resistor R3 from terminal A to terminal C. At this time terminal A is at approximately 1.2 volts while terminal C is at approximately 1.0 volt. The current i2D contributes to the current i2F to maintain the diode D5 in a slightly conducting state so that a minimal amount of infrared radiation 14 may be emitted therefrom. It will be noted at this time that the shutter Sh has completed movement in the direction U as shown in FIG. 5 so that essentially all of the radiation 14 is blocked from impinging upon the photosensitive surface or region of the transistor Q3 (not shown in detail in FIG. 6). Consequently, the Darlington-Pair configuration Q2-Q3 is essentially in the off or non-electrically conducting state, that is the current i2B' which flows therethrough can be considered as low level leakage current. As depicted in FIG. 6 the Darlington-Pair configuration Q2-Q3 resembles an open circuit at this time. Current i2X which flows into the gate of the silicon controlled rectifier Q1 is essentially the same as the current i2B, the only difference being the small amount of leakage current i2B' which leaks through the generally non-electrically conducting Darlington-Pair configuration Q2-Q3. This essentially guarantees that sufficient gate current is available for the saturated or heavily conducting silicon controlled rectifier Q1 so that a large amount of electrical current i2A may flow therethrough. Electrical current i2C which flows between the cathode of the silicon controlled rectifier Q1 and the junction point A is essentially the same as electrical current i2A except for the component of electrial current represented by the gate current i2X. The electrical current i2G which flows through the serially connected diodes D6 and D7 is essentially the same as the current i2C previously described except for that component of current i2E which flows through the resistive element R3 into junction point C for the purpose of supplying current to the light emitting diode D5. The voltage point B or junction point B is at approximately 1.8 volts due to the fact that the capacitive element C1 has previously been charged to approximately that value.

Referring to FIG. 6A a simplified schematic diagram of the circuit of FIG. 6 is shown in which the switch 10 is shown in the closed configuration allowing current iLB to flow through the LOAD at a relatively high value.

Figure 7:
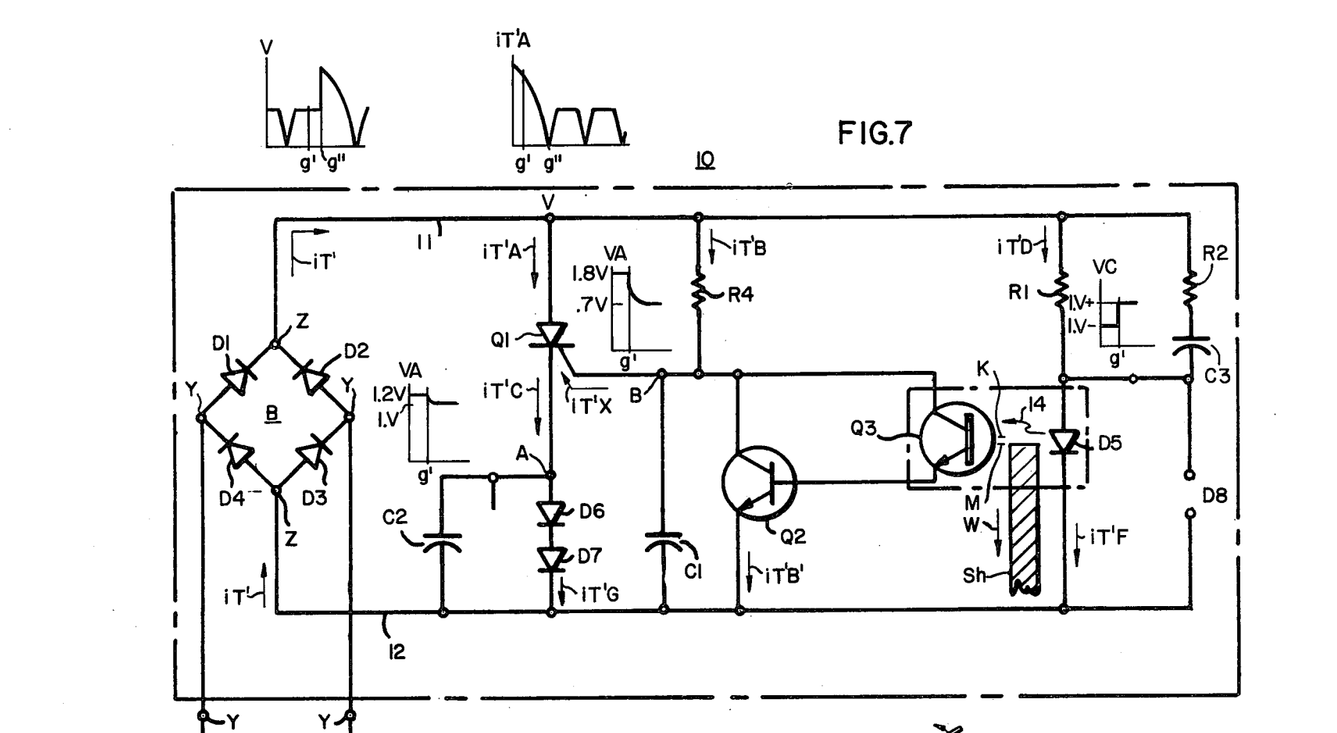
FIG. 7 shows the circuit of FIG. 3 during the transient between the switch off and the switch-on stage.

Referring now to FIG. 7 the circuit of FIG. 3 is shown in a transient state between the on condition of FIG. 6 and the off condition of FIG. 4. During this transient condition the shutter Sh is withdrawn from its position as shown in FIG. 6 in the direction W. During withdrawal of the shutter Sh, a portion of the infrared light 14 from the diode D5 is once again allowed to strike and photosensitive surface or region of the photosensitive transistor Q3. It is to be recalled that previous to this the diode D5 was energized at a low level with current to provide a low level of infrared light 14 which was available for energizing transistor Q3. During the time span of FIG. 7, as the shutter Sh is moved in the direction W the amount of light 14 which is available for impinging upon the transistor Q3 increases to the point where that transistor changes states from the off condition of FIG. 6 to an active condition, that is the condition where the current flowing through the collector-to-emitter circuit of transistor Q2 is generally related to the magnitude of light striking the base or photosensitive region of the transistor Q3. Since the magnitude of the current iT"B flowing through resistive element R4 is generally fixed, the present conductance of the collector-to-emitter circuit of the Darlington-Pair combination Q2-Q3 sinks or diverts current iT'B' away from the gate of the saturated or fully turned on silicon controlled rectifier Q1. This therefore has the effect of diminising gate current iT'X. The capacitive element C1 cooperates with the collector-to-emitter circuit of the Darlington-Pair combination Q2-Q3 to allow the voltage across the capacitive element C1 between the junction point B and line 12 to begin to drop with a specified time constant from approximately 1.8 volts towards approximately 0.7 volts. Meanwhile, as had been mentioned previously, the value of the current iT'X during this transient stage is also continuously diminished due to the ever increasing conductance of the Darlington-Pair combination Q2-Q3. Eventually a point in time g' reached where the voltage of the junction point B or at the gate of the silicon controlled rectifier Q1 and the value of the current iT'X are insufficient to maintain the silicon controlled rectifier Q1 in the saturated or on state. It will be noted at this time that the voltage drop at the junction point A remains at approximately 1.2 volts even though the voltage at junction point B changes from approximately 1.8 volts to somewhat less than 1.2 volts. Immediately prior to reaching point g', the current iT'C flowing between the cathode of the silicon controlled rectifier Q1 and the junction A is approxmately equal to the current iT'A which is flowing through the anode-to-cathode circuit of the silicon controlled rectifier Q3. The difference in current value is the contribution added by the component of current iT'X in the gate circuit of the silicon controlled rectifier Q1. The current iT'G flowing through the diodes D6 and D7 is approximately equal to the current iT'C. The capacitive element C2 comes into play as the silicon controlled rectifier Q1 is turned off, when the point g' is reached, to provide a fall time constant for the voltage at the point A as that voltage drops from approximately 1.2 volts to approximately 1.0 volt. Because of the characteristic of silicon controlled rectifier and similar gated valves of that type, the current iT'A will not diminish to zero immediately merely because the gate circuit of the silicon controlled rectifier Q3 has been placed in a condition which would normally cause the silicon controlled rectifier to be non-conducting. Rather the current iT'A will go to zero at the next succeeding current zero of the current iT' or iLT'. When this happens the voltage across lines 11 and 12 jumps to a high value relatively fast. In this case that voltage is approximately equal to the voltage of the source S. The positive voltage transient is picked up by the capacitive element C3 working in conjunction with the resistive element R2. The high rate of change $dv/dt$ is converted by a snubber circuit including the last two mentioned elements to provide an impulse of electrical current to the junction point C which current is available to saturate or drive the diode D5 into a highly conductive state. This occurs simultaneously or approximately simultaneously with the changing of the voltage at the junction point C from a voltage of approximately slightly less than 1.0 volt to a voltage of approximately slightly greater than 1.0 volt. This strong positive latching effect provided by the capacitive element C3 causes the amount of infrared radiation 14 emanating from the diode D5 to increase rapidly even though the shutter has not been significantly further moved in a direction W during the preceding transient interval. The significantly inreased infrared radiation 14 impinges upon the photosensitive region of the Darlington-Pair combination Q2-Q3 causing that Darlington-Pair combination to quickly saturate to an on state so that there is a sink for current iT'B through the collector-to-emitter circuit of the transistor Q2. The sinking current is known as iT'B'. At this point the circuitry of FIG. 7 approaches the conditions outlined and described with respect to FIG. 4.

Figure 7A:
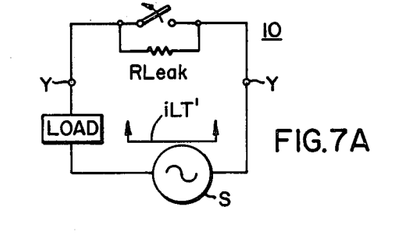
FIG. 7A shows a simplified schematic diagram of the circuit shown in FIG. 7.

By referring to FIG. 7A the off transient state of FIG. 7 is shown in a simplified manner. The switch 10 is shown being moved from a closed to an open position. At this time the current iLT' is rapidly reduced from full LOAD current to the leakage current previously described with respect to FIG. 4.

Referring to FIGS. 5 and 7 once again the phenomenon of hysteresis is depicited. Specifically it can be seen that during the off-to-on transient of FIG. 5 the shutter Sh must move to a point generally designated K in FIG. 5 to diminish the infrared radiation 14 enough to cause the switch Q1 to change from the non-saturated or off condition to the saturated or on condition. This is because the current iTF is relatively large at this time. With regard to the transient condition shown in FIG. 7 where the switch is generally designated as going from the on condition to the off condition, it will be remembered that the amount of current i2F shown in FIG. 6 which was available for energizing the diode D5 immediately prior to the movement of the shutter Sh in the direction W was significantly less than the amount of current i1F shown in FIG. 4. Consequently, the shutter Sh must be moved to a point M before sufficient infrared energy 14 is available to energize the Darlington-Pair combination Q2-Q3 to begin an operation which will turn the silicon controlled rectifier Q1 off. The difference between point K and point M represents switch hysteresis.

It is to be understood with respect to the various embodiments of this invention that the Darlington-Pair configuration Q2-Q3 may be replaced by another single or plural photosensitive means provided the latter photosensitive means is capable of controlling current in a manner generally equivalent to or similar to the way that the Darlington-Pair configuration Q2-Q3 controls current as described with respect to the various figures. In another embodiment of the invention transistor Q3 may be used alone in replacement of transistor combination Q2-Q3. It is also to be understood that the LOAD referred to herein may be a relay coil or a circuit or any other means which is available and useful for accomplishing the purposes of this invention. As an example, since it can be seen that the LOAD is energized as the shutter moves inwardly in the direction U, the LOAD may comprise a relay coil which controls a relay which in turn energizes an electric motor causing a workpiece to change direction so as to move the shutter in the opposite direction such as depicted in FIG. 7. It is also to be understood that the shutter is not limiting but is illustrative of the concept of providing a visible range light opaque means between a light emitting source and phototransistor where both the light emitting source and phototransistor are operable in the infrared region of light. It is also to be understood that the depiction of the capacitive elements as being batteries is for the purpose of illustration. It is also to be understood that the device generally designated Q1 and variously called a silicon controlled rectifier or gated valve may in fact be a thyristor. It is also to be understood that the various voltage and current levels specifically described with respect to the figures of this application and the preferred embodiments of the invention are not limiting but only illustrative of certain particular embodiments.

The apparatus embodying the teachings of this invention have many advantages. One advantage lies in the fact that the circuit is relatively fail-safe, that is the output circuitry or switch will fail to a closed position if the light path 14 becomes blocked by foreign matter or the phototransistor or light emitting diode fails. Another obvious advantage lies in the fact that because infrared optical techniques are utilized, operation of the circuit is not retarded or restricted because of the presence of visible light, opaque oils, and/or cutting fluids in the infrared channel 14 as the absorption spectrum of most of the commercially known oils and cutting fluids provides an infrared transmission window even though these fluids and liquids do not provide a visible range window.

What I claim as my invention is:

1. A limit switch, comprising:

two terminal circuit means the terminals of which are externally disposed in series circuit relationship with a source of electrical power and a load for electrically disconnecting said load from said source of power under a predetermined condition;

infrared light sensitive switch means connected internally of said circuit means in series circuit relationship with said terminals of said circuit means for electrically providing said predetermined condition to disconnect said load from said source of electrical power when an amount of infrared light striking said infrared light sensitive switch means is of a predetermined value;

infrared light source means connected internally of said circuit means in circuit relationship with said terminals of said circuit means for supplying infrared light to said infrared light sensitive switch means; and movable shutter means for interposition between said infrared light source means and said infrared light sensitive switch means to thereby control the amount of said infrared light which strikes said light sensitive switch means, said shutter means being movable to a position relative to the position of said light source means and the position of said light sensitive switch means to limit the amount of said infrared light which strikes said light sensitive switch means to said predetermined value, said light sensitive switch means thereafter acting in conjunction with said two terminal circuit means to isolate said load from said source of electrical power, said light sensitive switch means thereafter also acting in conjunction with said two terminal circuit means to provide less infrared light to said light sensitive switch means without further movement of said shutter means to thus latch said load and said source of electrical power opened.

2. The combination as claimed in claim 1 wherein said circuit means comprises solid-state circuit elements.

3. The combination as claimed in claim 1 wherein said infrared light sensitive switch means comprises a phototransistor.

4. The combination as claimed in claim 1 wherein said infrared light source means comprises an infrared light emitting diode.

5. The combination as claimed in claim 1 wherein said shutter means is generally opaque to infrared light.

* * * * *